(12) United States Patent
Rogers

(10) Patent No.: US 7,713,379 B2
(45) Date of Patent: May 11, 2010

(54) PLASMA CONFINEMENT RINGS INCLUDING RF ABSORBING MATERIAL FOR REDUCING POLYMER DEPOSITION

(75) Inventor: James H. Rogers, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 596 days.

(21) Appl. No.: 11/155,493

(22) Filed: Jun. 20, 2005

(65) Prior Publication Data

US 2006/0283552 A1 Dec. 21, 2006

(51) Int. Cl.
*H01L 21/00* (2006.01)

(52) U.S. Cl. ............................. 156/345.43; 118/723 R

(58) Field of Classification Search ............ 156/345.43, 156/345.44, 345.45, 345.46, 345.47; 119/723 E
See application file for complete search history.

(56) References Cited

U.S. PATENT DOCUMENTS

| | | | |
|---|---|---|---|
| 5,534,751 A * | 7/1996 | Lenz et al. | 315/111.71 |
| 5,569,356 A * | 10/1996 | Lenz et al. | 438/729 |
| 5,685,949 A * | 11/1997 | Yashima | 438/694 |
| 5,865,896 A * | 2/1999 | Nowak et al. | 118/723 I |
| 5,904,778 A * | 5/1999 | Lu et al. | 118/723 R |
| 5,998,932 A | 12/1999 | Lenz | |
| 6,019,060 A | 2/2000 | Lenz | |
| 6,063,234 A | 5/2000 | Chen et al. | |
| 6,073,577 A | 6/2000 | Lilleland et al. | |
| 6,090,304 A | 7/2000 | Zhu et al. | |
| 6,096,161 A | 8/2000 | Kim et al. | |
| 6,129,806 A * | 10/2000 | Kaji et al. | 156/345.46 |
| 6,178,919 B1 | 1/2001 | Li et al. | |
| 6,227,140 B1 * | 5/2001 | Kennedy et al. | 118/723 R |
| 6,391,787 B1 | 5/2002 | Dhindsa et al. | |
| 6,451,157 B1 | 9/2002 | Hubacek | |
| 6,464,843 B1 * | 10/2002 | Wicker et al. | 204/192.15 |
| 6,527,911 B1 | 3/2003 | Yen et al. | |
| 6,812,646 B2 | 11/2004 | Windhorn et al. | |
| 2002/0086118 A1 | 7/2002 | Chang et al. | |
| 2003/0029567 A1* | 2/2003 | Dhindsa et al. | 156/345.47 |
| 2003/0084999 A1 | 5/2003 | Parsons et al. | |
| 2003/0196755 A1* | 10/2003 | Antolik | 156/345.1 |
| 2005/0039682 A1* | 2/2005 | Dhindsa et al. | 118/723 E |

OTHER PUBLICATIONS

International Search Report and Written Opinion dated Jul. 30, 2008 for PCT/US06/23198.
Singapore Search and Examination Report dated Jun. 17, 2009 for Singapore Appln. No. 200718799-0.

\* cited by examiner

*Primary Examiner*—Parviz Hassanzadeh
*Assistant Examiner*—Michelle Crowell
(74) *Attorney, Agent, or Firm*—Buchanan, Ingersoll & Rooney PC

(57) ABSTRACT

Plasma confinement rings are adapted to reach sufficiently high temperatures on plasma-exposed surfaces of the rings to substantially reduce polymer deposition on those surfaces. The plasma confinement rings include an RF lossy material effective to enhance heating at portions of the rings. A low-emissivity material can be provided on a portion of the plasma confinement ring assembly to enhance heating effects.

15 Claims, 4 Drawing Sheets

PLASMA CONFINEMENT RINGS INCLUDING RF ABSORBING MATERIAL FOR REDUCING POLYMER DEPOSITION

BACKGROUND

Plasma processing chambers can include an upper electrode and a lower electrode. The upper electrode typically faces a substrate support adapted to support a semiconductor substrate during plasma processing. During the plasma processing, power is supplied to one or both electrodes to activate the process gas and produce the plasma to process the substrate.

Plasma etching can be performed in plasma processing chambers to etch selected materials provided as layers on a semiconductor substrate. The processing conditions are chosen so that the plasma etches desired features in the layers.

SUMMARY

An embodiment of a plasma confinement ring for a plasma confinement ring assembly for a plasma processing chamber comprises a surface and an RF lossy material. The RF lossy material is effective to couple RF energy such that the surface reaches a sufficiently high temperature to substantially reduce polymer deposition on the surface when the plasma confinement ring is exposed to plasma in the plasma processing chamber.

An embodiment of a plasma confinement ring assembly for a plasma processing chamber comprises at least two plasma confinement rings arranged in a stack. Each of the plasma confinement rings comprises a plasma-exposed surface and an RF lossy material. When the plasma confinement rings are exposed to plasma in the plasma processing chamber, the RF lossy material is effective to couple RF energy such that the plasma-exposed surface of each plasma confinement ring reaches a sufficiently high temperature to substantially reduce polymer deposition on the plasma-exposed surface.

Another embodiment of a plasma confinement ring assembly for a plasma processing chamber comprises at least two plasma confinement rings arranged in a stack. Each of the plasma confinement rings comprises a plasma-exposed surface of an RF lossy material. When the plasma confinement rings are exposed to plasma in the plasma processing chamber, the RF lossy material is effective to couple RF energy such that the plasma-exposed surface of each plasma confinement ring reaches a sufficiently high temperature to substantially reduce polymer deposition on the plasma-exposed surface.

A further embodiment of a plasma confinement ring assembly for a plasma processing chamber comprises at least two plasma confinement rings arranged in a stack. Each of the plasma confinement rings comprises a plasma-exposed surface and an embedded RF lossy material which is not exposed to plasma. When the plasma confinement rings are exposed to plasma in the plasma processing chamber, the RF lossy material is effective to couple RF energy such that the plasma-exposed surface of each plasma confinement ring reaches a sufficiently high temperature to substantially reduce polymer deposition on the plasma-exposed surface.

Another embodiment of a plasma confinement ring assembly for a plasma processing chamber comprises a mounting ring including an inner ring adapted to be supported on an outer ring. The inner ring includes a plasma-exposed inner surface, an outer surface opposite to the inner surface, and a coating of an electrically-conductive, low-emissivity material on the outer surface. At least two plasma confinement rings are adapted to be arranged in a stack and suspended from the mounting ring.

An embodiment of a method of processing a semiconductor substrate in a plasma processing chamber comprises supplying process gas into a plasma processing chamber comprising at least two plasma confinement rings arranged in a stack, where each of the plasma confinement rings comprises a plasma-exposed surface and an RF lossy material; and producing a plasma from the process gas and etching a semiconductor substrate in the plasma processing chamber. During the etching, the RF lossy material couples RF energy such that the plasma-exposed surface of each plasma confinement ring reaches a sufficiently high temperature to substantially reduce polymer deposition on the plasma-exposed surface.

BRIEF DESCRIPTION OF THE DRAWING FIGURES

DETAILED DESCRIPTION OF PREFERRED EMBODIMENTS

Figure 1:
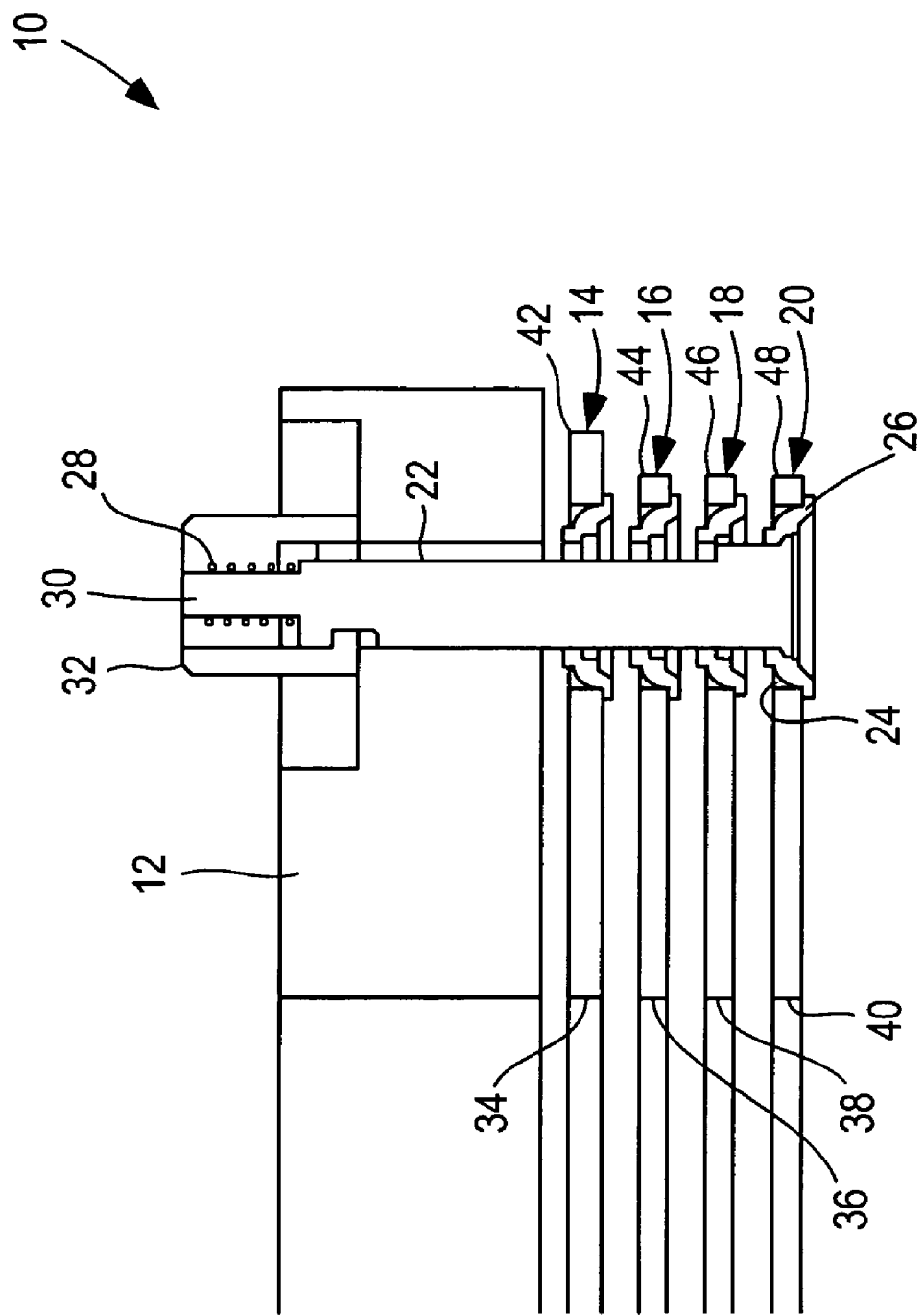
FIG. 1 illustrates a portion of an embodiment of a plasma confinement ring assembly.

Parallel-plate plasma processing chambers, such as capacitively-coupled chambers, include an upper electrode, such as a showerhead electrode, and a lower electrode. The upper electrode typically faces a semiconductor substrate to be processed. During the plasma processing, power is supplied to one or both electrodes to activate the process gas and produce the plasma to process the substrate.

Interior surfaces of such plasma processing chambers can be powered surfaces (e.g., "RF hot surfaces"), grounded surfaces, or floating surfaces (comprised of insulating materials). Different energy is supplied to, or impinges on, these different types of surfaces during plasma processing. The heating characteristics of a chamber part in a parallel-plate plasma processing chamber depends upon the ion energy and the ion flux supplied to the part's exposed surfaces, and also on the infrared (IR) energy absorption characteristics of the part. Grounded (return path) surfaces and powered surfaces receive significant ion energy from plasma. As a result, these surfaces tend to be heated more than floating parts or surfaces, and also to reach significantly different temperatures.

Highly-polymerizing process gas chemistries, such as process gases containing fluorocarbons, hydrofluorocarbons, or precursors of such gases, can be used to etch dielectric materials, such as silicon oxide. During such plasma etch processes, polymer can deposit on internal surfaces of the plasma processing chamber. The polymer deposits are undesirable because they can flake off of the surfaces and contaminate processed substrates (e.g., processed wafers), as well as contaminate the chamber. However, as device features continue to shrink, it becomes increasingly desirable to maintain substrates and plasma-exposed chamber surfaces clean from wafer-to-wafer to achieve repeatable process results. Accordingly, it is desirable to reduce, and preferably to prevent, the formation of polymer etch deposits on internal surfaces of chamber parts.

During plasma processing operations, heat can be transferred from and/or to parts and other chamber surfaces by thermal conduction (when the part is in physical contact with another surface), radiation (when electromagnetic waves carry heat to and/or from the part) and convection (when heat is carried by a moving fluid in the chamber). Convective heat losses from parts increase with increasing chamber pressure. The temperature increase, $\Delta T$, of a plasma-exposed part or surface during plasma processing depends on the amount of heat, Q, added to the part or surface, and the mass, m, and the specific heat, c, of the part; according to the following relationship: $Q=mc\Delta T$. Accordingly, for a given amount of heat added to a part, increasing the part mass decreases the increase in temperature of the part. Consequently, a part having high mass (or high heat capacity) may not reach a sufficiently high temperature during plasma processing to avoid polymer deposition on plasma exposed surfaces of the part.

Generally, polymer deposits are more likely to form on cooler plasma-exposed surfaces of the plasma processing chamber during plasma processing operations. Floating surfaces tend to be cooler surfaces, making them generally more prone to develop polymer buildup as compared to powered surfaces or grounded surfaces.

The problem of polymer deposition on plasma-exposed surfaces of some parts in plasma processing chambers can be addressed by actively heating the part(s). For example, chamber walls can be heated to keep their plasma-exposed interior surface(s) at a sufficiently high temperature to avoid polymer deposition on the surface(s). Active temperature control of showerhead electrode assemblies and electrostatic chucks can also be used. However, because such surfaces are powered or grounded and consequently are subject to high ion energy, polymer is less likely to deposit on these surfaces than on floating surfaces even without active heating of the powered or grounded surfaces.

Alternatively, the polymer deposition problem can be addressed by removing as-formed polymer deposits from chamber surfaces. For example, polymer deposits can be removed using aggressive plasma chemistries. Alternatively, the plasma chamber can be wet cleaned to remove polymer deposits from chamber surfaces. However, such cleaning techniques reduce process throughput.

In order to achieve desirable process efficiency and etch uniformity, plasma can be confined within a plasma confinement zone defined between the upper and lower electrodes of a parallel-plate plasma processing chamber. Plasma confinement ring assemblies can be used to provide such plasma confinement. Exemplary plasma confinement ring assemblies are disclosed in commonly-owned U.S. Pat. Nos. 5,534,751; 5,998,932; 6,019,060; 6,178,919 and 6,527,911, each of which is incorporated herein by reference in its entirety. As described in U.S. Pat. No. 5,534,751, a plasma confinement ring assembly can include a plurality of plasma confinement rings. The rings are arranged in a stack to define a plurality of gas passages extending radially between adjacent rings from an inner surface to an outer surface. Charged particles in the plasma are neutralized as the particles pass through the passages, thereby minimizing the tendency for a discharge outside the plasma confinement zone (i.e., "unconfinement" of the plasma).

As also described in U.S. Pat. No. 5,534,751, plasma confinement ring assemblies may confine polymer deposition during plasma etch processes to only the plasma confinement rings themselves. However, it is desirable to substantially reduce, and preferably to prevent, such polymer deposition on the confinement rings in order to substantially reduce, and preferably prevent, chamber and substrate contamination problems, as well as to avoid additional chamber cleaning steps performed to remove as-formed polymer deposits from the plasma confinement rings.

In light of the above-described polymer deposition problem, it has been determined that plasma confinement rings can be provided that are adapted to reach sufficiently high temperatures on plasma-exposed surfaces of the rings to substantially reduce, and to preferably prevent, polymer deposition on those surfaces, without actively heating the surfaces. More particularly, the plasma confinement rings can localize heating at selected portions of the rings that include plasma-exposed surfaces. Heating is localized by an RF lossy material.

As used herein, an "RF lossy material" is an electrically conductive material that can absorb RF energy, i.e., a material that is not transparent to RF radiation. Accordingly, the RF lossy material can couple RF energy. Consequently, the RF lossy material is heated. Exemplary RF lossy materials that can be used in the plasma confinement rings include, but are not limited to, doped Si (i.e., silicon that has been doped with a suitable type and amount of dopant to control its electrical resistivity) and SiC. In addition, the RF lossy material can be a metallic material, including metals, metal alloys and magnetic materials, for some embodiments of the plasma confinement rings.

The RF lossy material has a skin depth. The "skin depth" is commonly defined as the depth below the surface of a conductor at which the current is 1/e (0.37) times the current at the surface. The skin depth, d, is given by the following equation: $d=(2\rho/\omega\mu)^{1/2}$, where $\rho$ is the material electrical resistivity, $\omega$ is the angular frequency of current (i.e., $\omega=2\pi f$, where f is frequency), and $\mu$ is the absolute magnetic permeability of the material. According to this equation, the skin depth increases as the electrical resistivity of the RF lossy material increases. For example, it has been reported that the electrical resistivity of SiC can vary from about $10^2$ $\mu\Omega$-cm to about $10^5$ $\mu\Omega$-cm. Accordingly, over this electrical resistivity range and at an RF frequency of 13.56 MHz, the skin depth of SiC can range from about 150 $\mu$m to about 5000 $\mu$m.

In addition to being electrically conductive, the RF lossy material preferably has a sufficient volume (i.e., thermal mass) so that it can absorb sufficient RF energy during the period that plasma is produced in the plasma processing chamber, so that the RF lossy material reaches a sufficiently high temperature to substantially reduce, and to preferably prevent, polymer deposition on the RF lossy material. In an embodiment, the RF lossy material can have a suitable thickness to couple with RF energy and provide a sufficient thermal mass. For example, the thickness of the RF lossy material that is used can range from about the skin depth to about three times the skin depth of the RF lossy material for the RF frequency that is incident on the RF lossy material in the plasma processing chamber. For use in plasma processing chambers that include more than one RF source that can supply RF power at more than frequency, the thickness of the RF material can be selected based on the lowest frequency to which the RF material is exposed in the plasma processing chamber, for example.

In the plasma confinement rings, the RF lossy material can be exposed to plasma in a plasma processing chamber. In other embodiments, the RF lossy material can be protected from being exposed to plasma. For example, the RF lossy material can be a coating on one or more surfaces of the plasma confinement rings. In another embodiment, a portion of one or more plasma confinement rings can be made of the RF lossy material. In a further embodiment, the RF lossy material can be embedded in one or more plasma confinement rings (i.e., enclosed by another material that is exposed to plasma) so that the RF lossy material is not exposed to plasma.

FIG. 1 depicts an embodiment of a plasma confinement ring assembly 10. Embodiments of the plasma confinement ring assembly 10 include at least two plasma confinement rings. The plasma confinement ring assembly 10 shown in FIG. 1 comprises, in a concentric arrangement, a mounting ring 12 and four plasma confinement rings 14, 16, 18 and 20 suspended from the mounting ring 12. The mounting ring 12 and the plasma confinement rings 14, 16, 18 and 20 are preferably vertically movable to adjust their positions in a plasma processing chamber, e.g., to control the size of the gaps between the plasma confinement rings. In FIG. 1, the plasma confinement rings 14, 16, 18 and 20 are shown in a stacked arrangement with radially-extending gaps between respective pairs of rings 14, 16; 16, 18; and 18, 20. The gaps provide gas flow passages.

The mounting ring 12 and the plasma confinement rings 14, 16, 18 and 20 are electrically floating parts of an electrically insulating (dielectric) material, such as quartz, fused silica, silicon nitride or alumina. High-purity quartz is a preferred material for these parts, and especially for use in etch processes for dielectric materials. Quartz is RF transparent.

In the embodiment shown in FIG. 1, the mounting ring 12 and each of the plasma confinement rings 14, 16, 18 and 20 are of a single piece of the insulating material.

As shown in FIG. 1, the plasma confinement rings 14, 16, 18 and 20 can be connected to the mounting ring 12 by mounting elements, such as elements including one or more hangers 22, each extending through a respective hole 24 formed in each of the plasma confinement rings 14, 16, 18 and 20. An insert 26 can be inserted in each hole 24 to prevent direct contact between the hanger 22 and the plasma confinement rings 14, 16, 18 and 20. A spring 28 can be mounted on an inner shaft 30 of the hanger 22 to resiliently bias the hanger 22 with respect to a fitting 32.

For etching round semiconductor substrates, the plasma confinement rings 14, 16, 18 and 20 include an inner diametric surface 34, 36, 38 and 40, respectively, and an outer diametric surface 42, 44, 46 and 48, respectively. The inner diametric surfaces 34, 36, 38 and 40 are plasma-exposed surfaces. The plasma confinement rings 14, 16, 18 and 20 have a suitable size for the substrate size to be processed, e.g., an inner diameter of about 17 inches for processing 300 mm wafers. As shown in FIG. 1, the inner diametric surfaces 34, 36, 38 and 40 of the respective plasma confinement rings 14, 16, 18 and 20 are preferably vertically aligned with each other and with the mounting ring 12.

In the embodiment, an RF lossy material is applied as a coating on one or more of, and preferably on each of, the inner diametric surfaces 34, 36, 38 and 40 of the respective plasma confinement rings 14, 16, 18 and 20. For example, the coating can be of doped silicon or SiC. The coating can be applied by any suitable deposition technique, such as sputter deposition, chemical vapor deposition (CVD), thermal or electron-beam evaporation, or plasma spray deposition. The coating preferably covers the entire inner diametric surface of the plasma confinement rings to maximize the heated surface area. In other embodiments, the coating can cover less than the entire inner diametric surface of one or more of the plasma confinement rings.

The coating of the RF lossy material can have a suitable thickness ranging, for example, from about the skin depth to about three times the skin depth of the RF lossy material for the RF frequency that is incident on the RF lossy material in the plasma processing chamber.

During plasma processing of semiconductor substrates, the plasma confinement rings 14, 16, 18 and 20 are heated by the plasma, and are also subject to other heat transfer mechanisms in the plasma processing chamber. The RF lossy material couples with RF energy and, consequently, is preferentially heated. As a result, the inner diametric surfaces 34, 36, 38 and 40 of the respective plasma confinement rings 14, 16, 18 and 20 can reach a sufficiently high temperature to substantially reduce, and preferably prevent, polymer deposition on these surfaces during plasma processing.

In another embodiment, one or more of, and more preferably each of, the plasma confinement rings of the confinement ring assembly are constructed to reduce heat conduction from the portion of the confinement ring that includes the RF lossy material to the portion of the confinement ring adjacent to the RF lossy material to thereby maintain the RF lossy material at a sufficiently high temperature to substantially reduce, and to preferably prevent, polymer deposition on the confinement ring. In the embodiment, one or more of, preferably each of, the plasma confinement rings includes a thermal choke that can reduce heat conduction away from the RF lossy material to adjacent portions of the plasma confinement ring.

Figure 2:
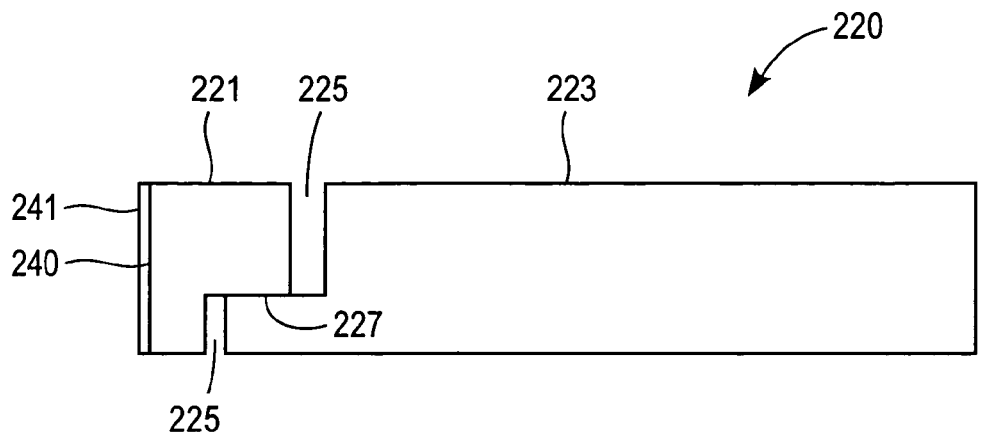
FIG. 2 is a side view of another embodiment of a plasma confinement ring having a two-piece construction.

In the embodiment, at least one of the plasma confinement rings of the plasma confinement ring assembly 10 can have a multi-piece construction. For example, the embodiment of the plasma confinement ring 220 shown in FIG. 2 comprises an inner ring 221 supported on an outer ring 223. The inner ring 221 and the outer ring 223 can be of a dielectric material, such as quartz or the like. The inner ring 221 includes a plasma-exposed inner diametric surface 240 on which a coating 241 of an RF lossy material is applied.

In another embodiment, the entire inner ring 221 is of the RF lossy material. For example, the inner ring 221 can be of doped silicon or SiC. The outer ring 223 can be of a suitable dielectric material, such as quartz or the like.

In the plasma confinement ring 220, the inner ring 221 is supported on the outer ring 223 to define at least one gap 225 between opposed surfaces of the inner ring 221 and the outer ring 223. The gap 225 acts as a thermal choke, which is effective to reduce heat conduction from the inner ring 221 to the outer ring 223, especially when the inner diametric surface 240 of the inner ring 221 is exposed to plasma. By providing the gap 225, the inner diametric surface 240 can be maintained at a sufficiently high temperature to substantially reduce, and to preferably prevent, polymer deposition on the surface 240 during plasma processing.

Figure 3A:
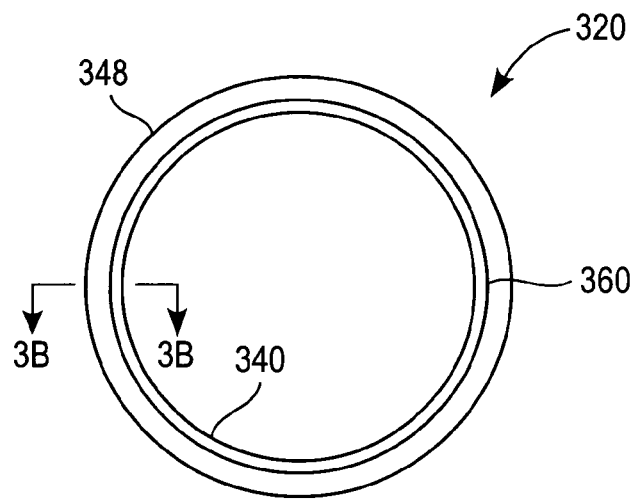
FIG. 3A is a top view of another embodiment of a plasma confinement ring comprising embedded RF lossy material.
Figure 3B:
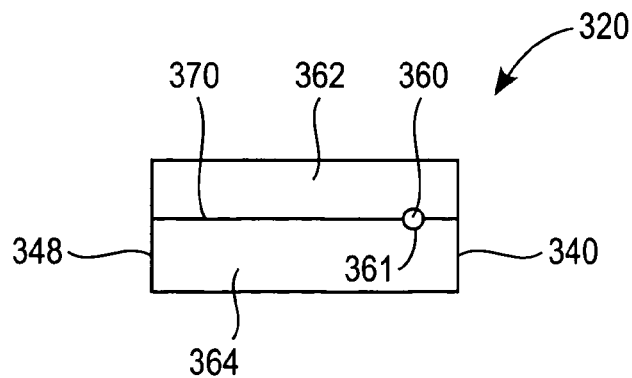
FIG. 3B is a cross-sectional view of the plasma confinement ring shown in FIG. 3A taken along line 3B-3B.

FIGS. 3A and 3B depict another embodiment of a plasma confinement ring 320 including an inner diametric surface 340 and an embedded, i.e., enclosed, RF lossy material 360. The embedded RF lossy material 360 can be provided in one or more of, and preferably in each of, the plasma confinement rings of the confinement ring assembly.

As shown in FIG. 3A, the RF lossy material can have a circular configuration. In order to maximize heating of the inner diametric surface 340 caused by heating of the RF lossy material 360 during plasma processing, the radial distance between the RF lossy material 360 and the inner diametric surface 340 can be minimized.

As shown in FIG. 3B, the plasma confinement ring 320 can have a two-piece construction including an upper ring portion 362 and a lower ring portion 364 joined along an interface 370. The RF lossy material 360 can be disposed in a depression 361 formed in the upper ring portion 362 and/or the lower ring portion 364. The depression 361 can have any suitable shape, such as semicircular, circular (as shown), a trench configuration, or the like. The depression 361 can be formed by a technique that is suitable for processing the material of the plasma confinement ring 320, such as laser ablation or etching. The RF lossy material 360 can extend continuously along the depression 361 to enhance heating uniformity around the entire inner diametric surface 340. Alternatively, the RF lossy material 360 can extend discontinuously. The RF lossy material 360 can be, for example, in the form of a solid bead or a powder.

The upper ring portion 362 and the lower ring portion 364 of the plasma confinement ring 320 can be joined along the interface 370 by any suitable joining technique. For example, the upper ring portion 362 and lower ring portion 364 can be bonded by a suitable adhesive, such as an elastomeric material compatible with chamber conditions typically faced by the plasma confinement rings during plasma processing of semiconductor substrates, such as described in commonly-owned U.S. Pat. No. 6,073,577, which is incorporated herein by reference in its entirety. The elastomer material can optionally include a filler of thermally conductive particles.

The elastomer can contain particles of a thermally conductive material, e.g., Si, SiC, metal or metal alloy to enhance the thermal conductivity of the elastomer. The metal is suitable for use in the impurity-sensitive environment of a plasma processing chamber. The thermally conductive elastomer can be applied at the interface 370 between the RF lossy material 360 and the inner diametric surface 340 to enhance heat transfer to, and thereby minimize polymer deposition on, the inner diametric surface 340.

In another embodiment, the upper ring portion 362 and lower ring portion 364 can be joined at the interface 370 by a welding technique. For example, the welding technique can be laser welding using a $CO_2$ laser, or the like. The upper ring portion 362 and lower ring portion 364 can be laser welded at the interface 370 around the inner diametric surface 340 and the outer diametric surface 348.

By embedding the RF lossy material 360 in the plasma confinement ring 320, the RF lossy material 360 is protected from being exposed to plasma. Accordingly, the RF lossy material 360 can be a material, such as a metal, metal alloy or magnetic material (e.g., ferrites) that provides RF coupling. The selected material can have a suitable thermal conductivity and volume to reach a sufficiently high temperature during plasma processing to result in sufficient heating of the plasma exposed inner diametric surface 340 to substantially reduce, and to preferably prevent, polymer deposition on the inner diametric surface 340.

Figure 4A:
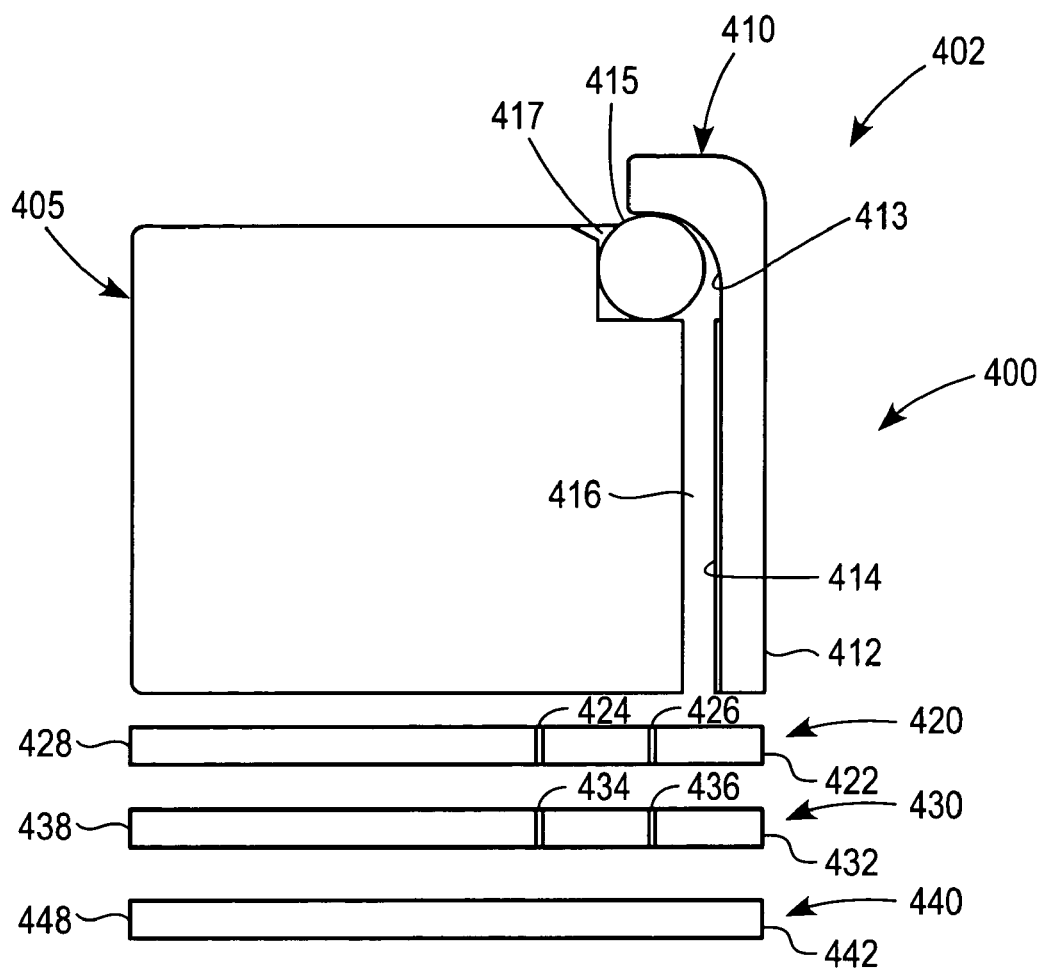
FIG. 4A illustrates another embodiment of a plasma confinement ring comprising a two-piece mounting ring.
Figure 4B:
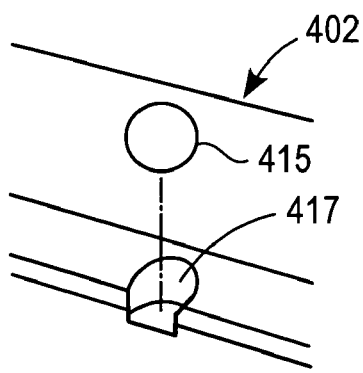
FIG. 4B is an enlarged partial view of the outer ring of the mounting ring shown in FIG. 4A, with a support element removed from a depression in the outer ring.
Figure 4C:
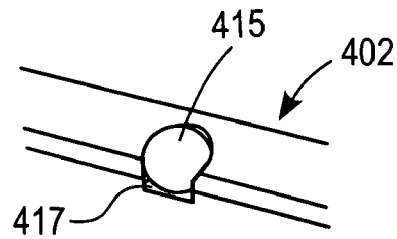
FIG. 4C illustrates the outer ring of the mounting ring shown in FIG. 4B, with the support element received in the depression in the outer ring.

FIGS. 4A-4C depict another embodiment of the plasma confinement ring assembly 400. The confinement ring assembly 400 comprises a mounting ring 402 and a stack of plasma confinement rings 420, 430 and 440 suspended from the mounting ring 402. The mounting ring 402 comprises an inner ring 410 supported on an outer ring 405. The inner ring 410 includes a plasma-exposed inner surface 412, an outer surface 413 opposite to the inner surface 412, and a coating 414 on the outer surface 413. The coating 414 is separated from the outer ring 405 by a gap 416, which provides a thermal choke.

The plasma confinement rings 420, 430, 440 include respective plasma-exposed inner surfaces 422, 432, 442, and outer surfaces 428, 438, 448. In the embodiment, the plasma confinement ring assembly 400 can include more than the three plasma confinement rings 420, 430 and 440, such as four or more rings, or it can include two rings.

In the embodiment, the inner ring 410 is preferably of an RF-transparent material, such as quartz. The gap 416 can reduce conductive heat transfer from the inner ring 410 to the outer ring 405. Heat losses from the inner ring 410 to the outer ring 405 can be dominated by radiation losses (dominated by $T^4$ emissivity). In order to reduce such radiation losses, the coating 414 on the outer surface 413 of the inner ring 410 is of an electrically-conductive, low-emissivity material. For example, the coating 414 can be a suitable metal, such as nickel, indium tin oxide (ITO), fluorinated tin oxide (FTO), or the like. Applying the coating 414 on the outer surface 413 results in the inner ring 410 radiating less power to the outer ring 405, i.e., in a diminished heat loss, which can effectively keep the inner ring 410 hotter. Also, because the inner ring 410 is transparent to RF, RF can result in currents in the coating 414, which results in power being dissipated in the coating. As the coating 414 is bonded to the inner ring 410, the coating 414 can supplement the heating power of the inner ring 410.

The inner ring 410 can have any suitable dimensions. For example, the thickness of the inner ring 410 can range from about 0.05 in. to about 0.30 in, preferably from about 0.10 in. to about 0.20 in.

In the embodiment, the outer ring 405 comprises a plurality of circumferentially-spaced depressions 417 formed at the inner periphery of the outer ring 405. FIGS. 4B and 4C show a portion of the outer ring 405 including a depression 417 and a support element 415 removably received in the depression 417 (FIG. 4C). As shown in FIG. 4A, the inner ring 410 is supported on the support element 415. The support elements 415 can be round balls, for example, or they can have other suitable shapes. Such round balls provide reduced contact area between the support elements 415 and the inner ring 410, which can reduce thermal conduction from the inner ring 410 to the outer ring 405. The support elements 415 can be of TEFLON (polytetrafluoroethylene), PEEK (polyetheretherketone), or the like.

As shown in FIG. 4A, the plasma confinement rings 420 and 430 can include thermal chokes 424, 426 and 434, 436, respectively. The confinement ring 440 can also include one or more thermal chokes. The thermal chokes 424, 426 and 434, 436 can be slots formed in the respective plasma confinement rings 420, 430. The thermal chokes can reduce heat transfer from the plasma-exposed inner surfaces 422, 432, respectively, when these surfaces are exposed to plasma during plasma processing operations. Consequently, the inner surfaces 422, 432 can reach a sufficiently high temperature to substantially reduce, and to preferably prevent, polymer deposition on the inner surfaces 422, 432 during plasma processing. Suitable thermal chokes that can be used for the plasma confinement rings 420, 430 and 440 of the plasma confinement ring assembly 400 are described in commonly-owned U.S. patent application Ser. No. 11/083,241, which is incorporated herein by reference in its entirety.

Plasma confinement rings of other embodiments of the plasma confinement ring assembly can also include thermal chokes. For example, one or more of the plasma confinement rings 14, 16, 18 and 20 of the plasma confinement ring assembly 10 shown in FIG. 1 can include one or more slots to further enhance heating of respective inner surfaces 34, 36, 38 and 40 during plasma processing.

The RF lossy material can substantially reduce, and preferably prevent, polymer deposition on the surface of the plasma confinement ring at which the RF lossy material is disposed (in embodiments in which the RF lossy material is exposed to plasma), or on surfaces adjacent to the RF lossy material (in embodiments in which the RF lossy material is not exposed to plasma). However, should a small amount of polymer deposit on any one of the plasma confinement rings during plasma processing operations, such polymer deposit can be removed from the plasma confinement ring(s) using an oxygen plasma treatment performed between the processing of successive wafers. The temperatures reached by the plasma confinement rings are preferably sufficiently high that polymer deposited on one or more of the plasma confinement rings can be substantially removed by the oxygen plasma. The chamber pressure during the oxygen plasma treatment can be about 500 mTorr to about 700 mTorr, for example.

In another embodiment, one or more plasma confinement rings of the confinement ring assembly can include an outer surface having surface roughness characteristics that enhance adhesion of polymer on the plasma confinement rings. In the embodiment, polymer that may deposit on the roughened surface during plasma processing of semiconductor substrates adheres to the surface such that the polymer does not flake off onto wafer surfaces or the semiconductor substrates. For example, in the multi-piece plasma confinement ring 220 shown in FIG. 2, the upper and/or lower surface of the outer ring portion 223 can be roughened (e.g., by shot blasting) to promote polymer adhesion on the surface(s).

Figure 5:
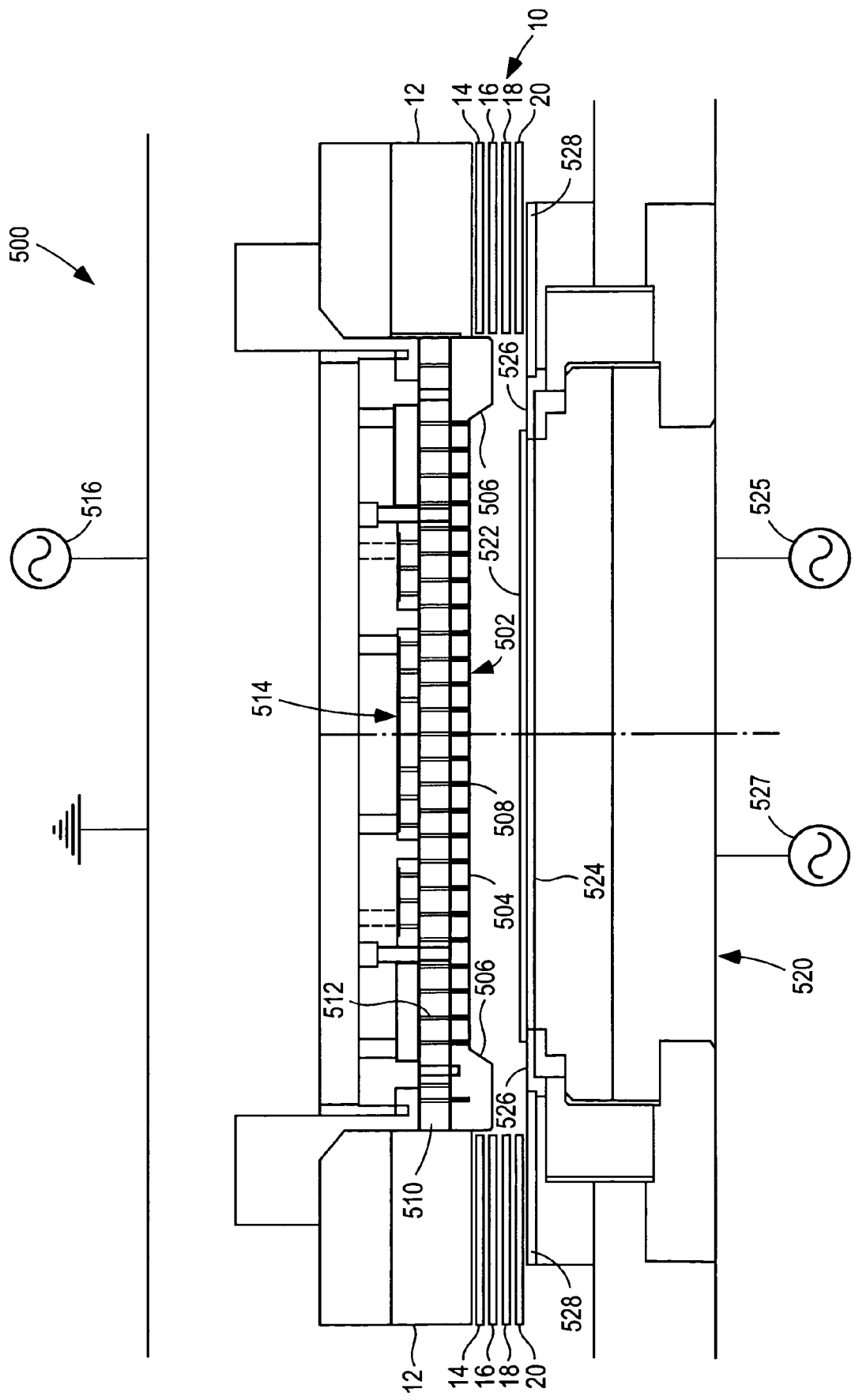
FIG. 5 illustrates a plasma processing chamber including an embodiment of the plasma confinement ring assembly.

FIG. 5 depicts an exemplary embodiment of a capacitively-coupled plasma processing chamber 500 in which the plasma confinement ring assembly 10 is installed. The plasma processing chamber 500 includes an upper electrode 502 having a bottom surface 504. In the embodiment, the bottom surface 504 includes a step 506 adapted to control a localized density of the plasma formed adjacent the exposed surface of the upper electrode 502, as described in U.S. Pat. No. 6,391,787, which is incorporated herein by reference in its entirety. In the embodiment, the upper electrode 502 is a showerhead electrode including gas passages 508 arranged for distributing process gas into the plasma processing chamber 500. The upper electrode 502 can be of silicon (e.g., single crystal silicon or polycrystalline silicon) or silicon carbide.

In the embodiment, the upper electrode 502 is a single-piece electrode (e.g., for 200 mm wafer processing). The upper electrode 502 can be mounted (e.g., elastomer bonded) to a backing member 510 of a suitable material, such as graphite or silicon carbide. The backing member 510 includes gas passages 512 in flow communication with corresponding gas passages 508 in the upper electrode 502.

In another embodiment, the upper electrode 502 can have a two-piece construction (e.g., for 300 mm wafer processing) and include a single-piece inner electrode member and an outer electrode member surrounding the inner electrode member, such as described in commonly-owned U.S. patent application Ser. No. 10/743,062, which is incorporated herein by reference in its entirety. In the embodiment, the backing member 510 can include a backing plate co-extensive with the inner electrode member and a backing ring co-extensive with the outer electrode member, as described in U.S. patent application Ser. No. 10/743,062.

In the embodiment of the plasma processing chamber 500 shown in FIG. 5, a thermal control plate 514 is supported on the backing member 510. The thermal control plate 514 can include one or more heaters operable to control the temperature of the upper electrode 502, as described in U.S. patent application Ser. No. 10/743,062.

The plasma processing chamber 500 includes a gas source (not shown) for supplying process gas to the upper electrode 502. The process gas is distributed in the chamber by the gas passages 508 in the upper electrode 502. The upper electrode 502 can be powered by an RF power source 516 via a matching network. In another embodiment, the upper electrode 502 can be electrically grounded to provide a return path for power supplied by a bottom electrode of the substrate support 520 of the plasma processing chamber 500.

In the embodiment, process gas is supplied into the plasma processing chamber 500 at the plasma generation region in the space between the upper electrode 502 and a semiconductor substrate 522, e.g., a semiconductor wafer, supported on a substrate support 520. The substrate support 520 can include an electrostatic chuck 524 that secures the semiconductor substrate 522 on the substrate support by an electrostatic clamping force. The electrostatic chuck 524 acts as a bottom electrode and can be biased by at least one of the RF power sources 525, 527 (typically via a matching network).

During plasma processing of the semiconductor substrate 522, the plasma confinement ring assembly 10 confines the plasma in a plasma confinement zone between the upper electrode 502 and the semiconductor substrate 522. Edge rings 526, 528 can be arranged to surround the semiconductor substrate 522 to focus the plasma so as to improve etch uniformity.

A vacuum pump (not shown) is adapted to maintain a desired vacuum pressure inside the plasma processing chamber 500.

An exemplary parallel-plate plasma reactor that can be used is a dual-frequency plasma etch reactor (see, e.g., commonly-owned U.S. Pat. No. 6,090,304, which is hereby incorporated by reference in its entirety). In such reactors, etching gas can be supplied to a showerhead electrode from a gas supply and plasma can be generated in the reactor by supplying RF energy at different frequencies from at least two RF sources to the showerhead electrode and/or a bottom electrode, or the showerhead electrode can be electrically grounded and RF energy at two or more different frequencies can be supplied to the bottom electrode.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma confinement ring for a plasma confinement ring assembly comprising a stack of plasma confinement rings with gaps therebetween for a plasma processing chamber, the plasma confinement ring comprising:
   at least one hole having an insert therein adapted to cooperate with a hanger which supports the plasma confinement ring in the stack of rings;
   a surface;
   an RF transparent material; and
   an RF lossy material;
   wherein the RF lossy material is adapted to couple RF energy such that the surface reaches a sufficiently high temperature to substantially reduce polymer deposition on the surface when the surface is exposed to plasma in the plasma processing chamber; and wherein the RF lossy material is doped silicon.

2. The plasma confinement ring of claim 1, wherein the RF lossy material is a coating on an inner diametric surface of the plasma confinement ring.

3. The plasma confinement ring of claim 1, wherein the plasma confinement ring comprises:

an inner ring comprising the RF lossy material;

an outer ring; and at least one gap between the inner ring and outer ring, the gap being effective to reduce heat conduction from the inner ring to the outer ring.

4. The plasma confinement ring of claim 3, wherein the inner ring consists essentially of the RF lossy material.

5. A plasma confinement ring assembly for a plasma processing chamber, comprising:

at least two plasma confinement rings arranged in a stack, each of the plasma confinement rings comprising a plasma-exposed surface, an RF transparent material, and means for coupling RF energy;

wherein the means for coupling RF energy is an RF lossy material adapted to raise the plasma-exposed surface of each plasma confinement ring to a sufficiently high temperature to substantially reduce polymer deposition on the plasma-exposed surface when the plasma confinement rings are exposed to plasma in the plasma processing chamber;

wherein the RF lossy material is doped silicon.

6. The plasma confinement ring assembly of claim 5, comprising:

a mounting ring; and mounting elements suspending the plasma confinement rings from the mounting ring.

7. The plasma confinement ring assembly of claim 5, wherein at least one of the plasma confinement rings comprises:

an inner ring comprising the plasma-exposed surface and the RF lossy material; and an outer ring adapted to support the inner ring such that a gap is defined between the inner ring and outer ring, the gap being effective to reduce heat conduction from the inner ring to the outer ring.

8. A plasma processing chamber, comprising:

an upper showerhead electrode;

a substrate support comprising a lower electrode; and a plasma confinement ring assembly according to claim 5 arranged to confine plasma in a space between the showerhead electrode and the substrate support.

9. A plasma confinement ring assembly for a plasma processing chamber, comprising:

at least two plasma confinement rings arranged in a stack, each of the plasma confinement rings comprising an RF transparent material and a plasma-exposed surface of an RF lossy material;

wherein the RF lossy material is adapted to couple RF energy such that the plasma-exposed surface of each plasma confinement ring reaches a sufficiently high temperature to substantially reduce polymer deposition on the plasma-exposed surface when the plasma confinement rings are exposed to plasma in the plasma processing chamber;

wherein the RF lossy material is doped silicon.

10. The plasma confinement ring assembly of claim 9, wherein the RF lossy material is a coating on an inner diametric surface of the plasma confinement rings.

11. The plasma confinement ring assembly of claim 9, comprising:

a mounting ring; and mounting elements suspending the plasma confinement rings from the mounting ring.

12. The plasma confinement ring assembly of claim 9, wherein at least one of the plasma confinement rings comprises:

an inner ring comprising the RF lossy material;

an outer ring; and at least one gap between the inner ring and outer ring, the gap being effective to reduce heat conduction from the inner ring to the outer ring.

13. The plasma confinement ring assembly of claim 12, wherein the inner ring consists essentially of the RF lossy material.

14. A plasma processing chamber, comprising;

an upper showerhead electrode;

a substrate support comprising a lower electrode; and a plasma confinement ring assembly according to claim 9 arranged to confine plasma in a space between the showerhead electrode and the substrate support.

15. The plasma confinement ring assembly of claim 5, wherein the RF lossy material is a coating on an inner diametric surface of each of the plasma confinement rings.

* * * * *